United States Patent
Chi

(10) Patent No.: US 12,205,628 B2
(45) Date of Patent: Jan. 21, 2025

(54) SENSE AMPLIFIER, METHOD FOR DRIVING SENSE AMPLIFIER, AND MEMORY

(71) Applicant: CHANGXIN MEMORY TECHNOLOGIES, INC., Hefei (CN)

(72) Inventor: Sungsoo Chi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 164 days.

(21) Appl. No.: 18/166,476

(22) Filed: Feb. 8, 2023

(65) Prior Publication Data

US 2023/0223072 A1 Jul. 13, 2023

Related U.S. Application Data

(63) Continuation of application No. PCT/CN2022/104447, filed on Jul. 7, 2022.

(30) Foreign Application Priority Data

Jan. 11, 2022 (CN) .......................... 202210027454.2

(51) Int. Cl.
G11C 11/40 (2006.01)
G11C 11/4091 (2006.01)

(52) U.S. Cl.
CPC .............................. *G11C 11/4091* (2013.01)

(58) Field of Classification Search
CPC ...... G11C 11/4091; G11C 7/1048; G11C 7/12
See application file for complete search history.

(56) References Cited

U.S. PATENT DOCUMENTS

| 8,928,357 B1 | 1/2015 | El-Mansouri |
| 9,773,544 B2 | 9/2017 | Woo |
| 10,224,093 B2 | 3/2019 | Kim |

(Continued)

FOREIGN PATENT DOCUMENTS

| CN | 1825477 A | 8/2006 |
| CN | 104575569 A | 4/2015 |

(Continued)

OTHER PUBLICATIONS

First Office Action of the U.S. Appl. No. 17/805,991, issued on Dec. 15, 2022.

*Primary Examiner* — Han Yang
(74) *Attorney, Agent, or Firm* — Syncoda LLC; Feng Ma

(57) ABSTRACT

A sense amplifier includes an amplifying circuit and a voltage equalizing circuit. The amplifying circuit includes: a first P-type transistor, having a first terminal connected to a third node, a second terminal connected to a first node, and a gate connected to a first bit line; a second P-type transistor, having a first terminal connected to the third node, a second terminal connected to a second node, and a gate connected to a second bit line; a first N-type transistor, having a first terminal connected to the first node, a second terminal connected to a fourth node, and a gate connected to the first bit line; a second N-type transistor, having a first terminal connected to the second node, a second terminal connected to the fourth node, a gate connected to the second bit line. The voltage equalizing circuit is connected between the first node and the second node.

20 Claims, 13 Drawing Sheets

(56) References Cited

U.S. PATENT DOCUMENTS

| | | | |
|---|---|---|---|
| 11,024,365 B1 | 6/2021 | Seo | |
| 2008/0074914 A1* | 3/2008 | Fang | G11C 11/4094 365/207 |
| 2008/0080282 A1* | 4/2008 | Chang | G11C 11/4091 365/205 |
| 2008/0123455 A1 | 5/2008 | Choi | |
| 2009/0122630 A1 | 5/2009 | Takahashi | |
| 2018/0182449 A1 | 6/2018 | Kim et al. | |
| 2019/0080660 A1 | 3/2019 | Kim et al. | |
| 2019/0180811 A1 | 6/2019 | Kim et al. | |
| 2020/0118614 A1 | 4/2020 | Kim et al. | |
| 2020/0227111 A1 | 7/2020 | Kim et al. | |
| 2020/0372948 A1 | 11/2020 | Kim et al. | |
| 2021/0272618 A1 | 9/2021 | Kim et al. | |
| 2022/0157369 A1 | 5/2022 | Kim | |

FOREIGN PATENT DOCUMENTS

| | | | |
|---|---|---|---|
| CN | 105225688 A | 1/2016 |
| CN | 109257024 A | 1/2019 |
| CN | 110620577 A | 12/2019 |
| CN | 111081296 A | 4/2020 |
| CN | 113193870 A | 7/2021 |

\* cited by examiner

SENSE AMPLIFIER, METHOD FOR DRIVING SENSE AMPLIFIER, AND MEMORY

CROSS-REFERENCE TO RELATED APPLICATIONS

This is a continuation of International Patent Application No. PCT/CN2022/104447 filed on Jul. 7, 2022, which claims priority to Chinese Patent Application No. 202210027454.2 filed on Jan. 11, 2022. The disclosures of the above-referenced applications are hereby incorporated by reference in their entirety.

BACKGROUND

In some implementations, a potential difference may occur between two nodes of a sense amplifier respectively connected to a bit line and a reverse bit line in a charge cancelling stage, and the potential difference may cause the signal amplification speed of the sense amplifier in a signal amplification stage to be reduced.

It is to be noted that the information disclosed in the above background art is only for enhancement of understanding of the background of the disclosure and therefore may include information that does not constitute related art that is already known to those of ordinary skill in the art.

SUMMARY

The disclosure relates to the technical field of storage, and in particular to a sense amplifier, a method for driving a sense amplifier, and a memory.

According to a first aspect of the disclosure, there is provided a sense amplifier, which includes: an amplifying circuit and a voltage equalizing circuit, and the amplifying circuit includes a first P-type transistor, a second P-type transistor, a first N-type transistor and a second N-type transistor. The first P-type transistor has a first terminal connected to a third node, a second terminal connected to a first node, and a gate connected to a first bit line. The second P-type transistor has a first terminal connected to the third node, a second terminal connected to a second node, and a gate connected to a second bit line. The first N-type transistor has a first terminal connected to the first node, a second terminal connected to a fourth node, and a gate connected to the first bit line. The second N-type transistor has a first terminal connected to the second node, a second terminal connected to the fourth node, and a gate connected to the second bit line. The voltage equalizing circuit is connected between the first node and the second node, and is configured to connect the first node and the second node in a charge sharing stage.

According to a second aspect of the disclosure, there is provided a method for driving a sense amplifier which is described above, the method including: when the voltage equalizing circuit is connected to a pre-charging voltage end,
  in a pre-charging stage, providing, by the voltage equalizing circuit, a preset voltage of the pre-charging voltage end to the first node and the second node; connecting, by the offset cancelling circuit, the first node and the first bit line, and connecting the second node and the second bit line; and connecting, by the isolation circuit, the first node and the second bit line, connecting the second node and the first bit line, and providing the preset voltage to the third node and the fourth node;
  in an offset cancelling stage, connecting, by the offset cancelling circuit, the first node and the first bit line, connecting the second node and the second bit line, providing a first level to the third node, and providing a second level to the fourth node;
  in the charge sharing stage, connecting, by the voltage equalizing circuit, the first node and the second node, and providing the preset voltage to the third node and the fourth node; and
  in a signal amplification stage, connecting, by the isolation circuit, the first node and the second bit line, connecting the second node and the first bit line, providing a first level to the third node, and providing a second level to the fourth node.

According to a third aspect of the disclosure, there is provided a memory, which includes the sense amplifier described above.

It is to be understood that the above general descriptions and detailed descriptions below are only exemplary and explanatory and not intended to limit the disclosure.

BRIEF DESCRIPTION OF THE DRAWINGS

The drawings, which are incorporated in and constitute a part of this specification, illustrate the embodiments consistent with the disclosure and, together with the specification, serve to explain the principles of the disclosure. It is apparent that the drawings described below are only some embodiments of the disclosure, and other drawings can further be obtained by those of ordinary skill in the art according to the drawings without creative work.

DETAILED DESCRIPTION

Figure 1:
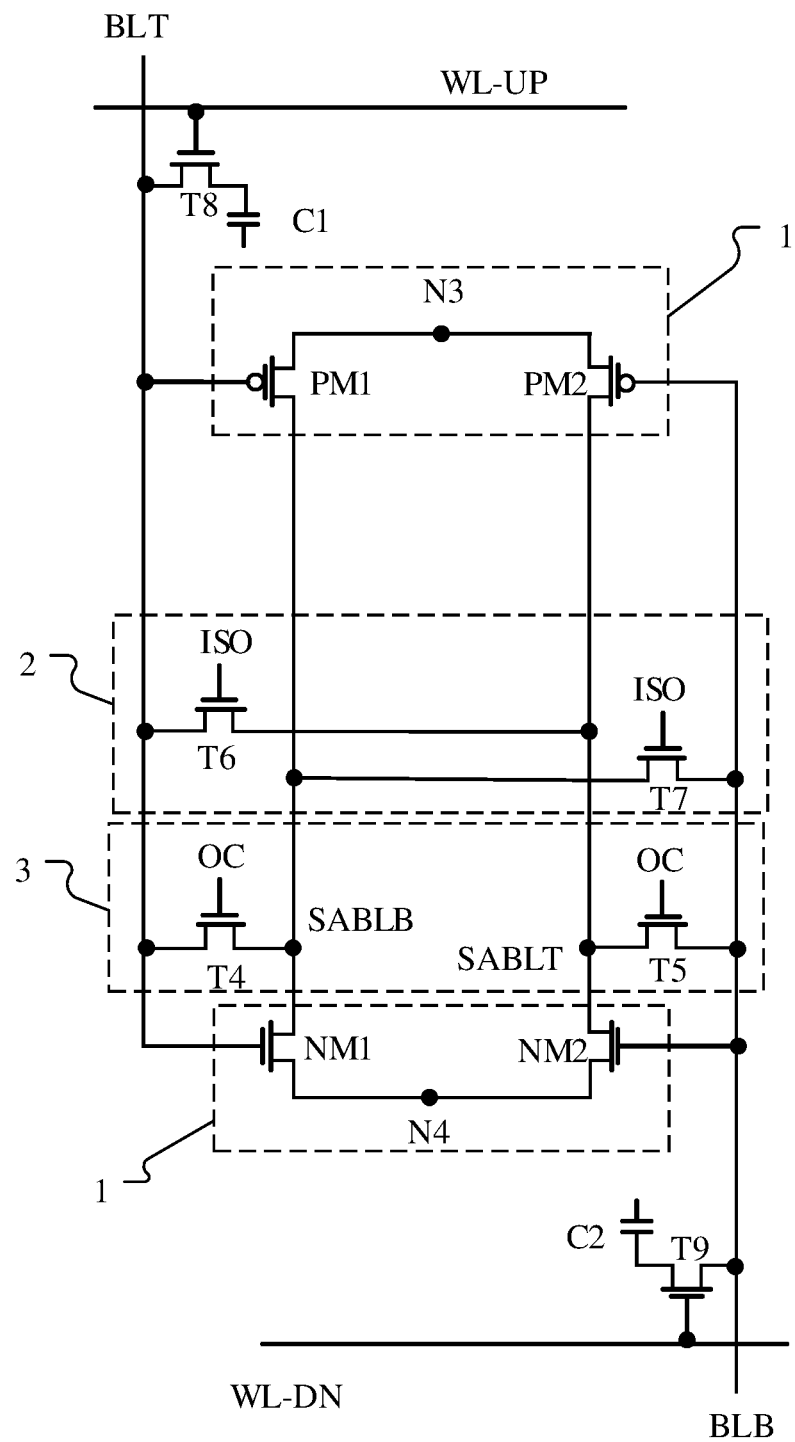
FIG. 1 is a schematic structural diagram of a sense amplifier according to an embodiment of the disclosure.

The embodiments will now be described more fully with reference to the drawings. The embodiments, however, can be implemented in many forms and should not be construed as limited to the sample set forth herein; rather, these embodiments are provided so that the disclosure will be more thorough and complete, and the concept of the embodiments will be fully conveyed to those skilled in the art. The same reference numerals in the figures denote the same or similar structures, and thus their detailed description will be omitted.

The terms "a" "an" and "the" are used to mean that there are one or more elements/components/the like; and the terms "comprising" and "having" are used in an open-ended inclusive sense and mean that there may be additional elements/components/the like in addition to the listed elements/components/the like.

FIG. 1 is a schematic structural diagram of a sense amplifier according to an embodiment of the disclosure. The sense amplifier may include an amplifying circuit 1, an isolation circuit 2 and an offset cancelling circuit 3. The amplifying circuit 1 may include a first P-type transistor PM1, a second P-type transistor PM2, a first N-type transistor NM1 and a second N-type transistor NM2. The first P-type transistor PM1 has a first terminal connected to a third node N3, a second terminal connected to a first node SABLB, and a gate connected to a first bit line BLT. The second P-type transistor PM2 has a first terminal connected to the third node N3, a second terminal connected to a second node SABLT, and a gate connected to a second bit line BLB. The first N-type transistor NM1 has a first terminal connected to the first node SABLB, a second terminal connected to a fourth node N4, and a gate connected to the first bit line BLT. The second N-type transistor NM2 has a first terminal connected to the second node SABLT, a second terminal connected to the fourth node N4, and a gate connected to the second bit line BLB.

The offset cancelling circuit 3 may include a fourth transistor T4 and a fifth transistor T5. The fourth transistor T4 has a first terminal connected to the first node SABLB, a second terminal connected to the first bit line BLT, and a gate connected to the second control signal end OC, and is configured to receive an offset cancelling signal. The fifth transistor T5 has a first terminal connected to the second node SABLT, a second terminal connected to the second bit line BLB, and a gate connected to the second control signal end OC, and is configured to receive an offset cancelling signal.

The isolation circuit 2 may include a sixth transistor T6 and a seventh transistor T7. The sixth transistor T6 has a first terminal connected to the first bit line BLT, a second terminal connected to the second node SABLT, and a gate connected to the third control signal end ISO, and is configured to receive an isolation signal. The seventh transistor T7 has a first terminal connected to the second bit line BLB, a second terminal connected to the first node SABLB, and a gate connected to the third control signal end ISO, and is configured to receive an isolation signal. In addition, the first bit line BLT may be connected to a first capacitor C1 through an eighth transistor T8, a gate of the eighth transistor T8 is connected to a first word line WL-UP, the second bit line BLB may be connected to a second capacitor C2 through a ninth transistor T9, and a gate of the ninth transistor T9 is connected to a second word line WL-DN. The fourth transistor T4, the fifth transistor T5, the sixth transistor T6, the seventh transistor T7, the eighth transistor T8 and the ninth transistor T9 all can be N-type transistors.

Figure 2:
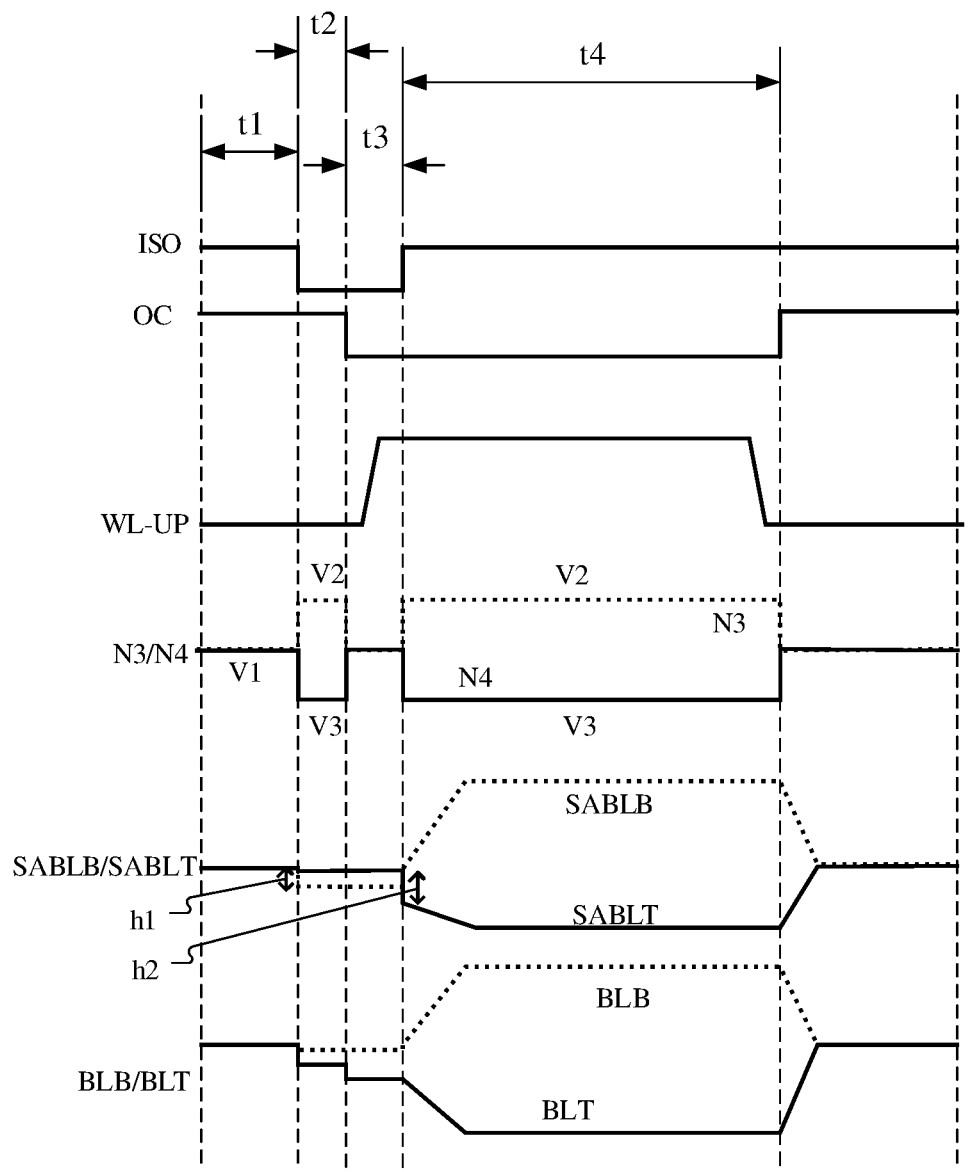
FIG. 2 is a timing diagram of each node in a method for driving a sense amplifier as shown in FIG. 1.

FIG. 2 is a timing diagram of each node in a method for driving a sense amplifier as shown in FIG. 1. Herein, OC represents a timing diagram of the second control signal end, ISO represents a timing diagram of the third control signal end, WL-UP represents a timing diagram of the first word line, N3 (dotted line) represents a timing diagram of the third node, N4 (solid line) represents a timing diagram of the fourth node, SABLB (dotted line) represents a timing diagram of the first node, SABLT (solid line) represents a timing diagram of the second node, BLB (dotted line) represents a timing diagram of the second bit line, and BLT (solid line) represents a timing diagram of the first bit line. The method for driving a sense amplifier may include four stages: a pre-charging stage t1, an offset cancelling stage t2, a charge sharing stage t3 and a signal amplification stage t4.

In the pre-charging stage t1, an offset cancelling signal is provided to the second control signal end OC to switch on the fourth transistor T4 and the fifth transistor T5. An isolation signal is provided to the third control signal end ISO to switch on the sixth transistor T6 and the seventh transistor T7. A pre-charging unit (not shown) can provide a same pre-charging voltage V1 to the first node SABLB, the second node SABLT, the third node N3 and the fourth node N4, to enable the voltages of the first bit line BLT, the second bit line BLB, the first node SABLB, the second node SABLT, the third node N3 and the fourth node N4 to be all equal to the pre-charging voltage V1. The pre-charging voltage V1 may be half of the power supply voltage VDD.

In the offset cancelling stage t2, a first level is provided to the third node N3, and a second level is provided to the fourth node N4. The first level may be a high level and second level may be a low level, for example, the first level may be the power supply voltage VDD, and the second level may be a voltage at ground. Furthermore, an offset cancelling signal is provided to the second control signal end OC, in some embodiments, when the second control signal end OC is an N-type transistor, the offset cancelling signal provided to the second control signal end OC is a high-level voltage, in this case, the fourth transistor T4 and the fifth transistor T5 are switched on, and the sixth transistor T6 and the seventh transistor T7 are switched off. In some embodiments, when the first level provided to the third node N3 is a high level and the second level provided to the fourth node N4 is a low level, due to the amplification difference between the first P-type transistor PM1 and the second P-type transistor PM2, and the amplification difference between the first N-type transistor NM1 and the second N-type transistor NM2, the voltages at the first node SABLB and the second node SABLT may deviate from the pre-charging voltage V1. Furthermore, in some cases, the voltage of the first node SABLB is not equal to the voltage of the second node SABLT. For example, as shown in FIG. 2, the voltage of the first node SABLB is smaller than the voltage of the second node SABLT. Since the first node SABLB is connected to the first bit line BLT through the fourth transistor T4 and the second node SABLT is connected to the second bit line through the fifth transistor T5, in the t2 stage, the voltage of the first bit line BLT is also smaller than the voltage of the second bit line BLB, so that offset noise caused by amplification difference between the first P-type transistor PM1 and the second P-type transistor PM2 and amplification difference between the first N-type transistor NM1 and the second N-type transistor NM2 can be effectively cancelled.

In the charge sharing stage t3, the third node N3 and the fourth node N4 are recovered to the preset voltage, the fourth transistor T4, the fifth transistor T5, the sixth transistor T6 and the seventh transistor T7 are all switched off. Furthermore, a switch-on voltage is provided to the first word line WL-UP, the eighth transistor T8 is switched on, a level signal stored in the first capacitor C1 is transmitted to the first bit line BLT, the level signal of the first capacitor C1 may be a low level or a high level. In some embodiments, the voltage of the first bit line BLT is further pulled down when the level signal of the first capacitor C1 is a low level, as shown in FIG. 2.

In the signal amplification stage t4, a first level is provided to the third node N3, and a second level is provided to the fourth node N4. After the first bit line BLT is further pulled down in the charge sharing stage, the first P-type transistor PM1 is switched on, the first node SABLB is connected to the third node N3, correspondingly, the second N-type transistor NM2 is switched on, and the second node SABLT is connected to the fourth node N4. In some embodiments, as shown in FIG. 2, the first node SABLB is pulled up to the first level and the second node SABLT is pulled down to the second level, implementing amplification of data. In such a case, an isolation signal is provided to the third control signal end ISO, the sixth transistor T6 and the seventh transistor T7 are switched on, the fourth transistor T4 and the fifth transistor T5 are switched off, the first bit line BLT is connected to the second node SABLT, the second bit line BLB is connected to the first node SABLB, and reading of the amplified data is achieved.

In some embodiments, as shown in FIG. 2, in the charge sharing stage t3, the voltage of the first node SABLB is smaller than the voltage of the second node SABLT, and in the initial stage of the signal amplification stage t4, the pull-up action of the third node N3 on the first node SABLB and the pull-down action of the fourth node on the second node SABLT need to overcome the voltage difference h1 between the first node SABLB and the second node SABLT, to enable the voltage of the first node SABLB to be higher than the voltage of the second node SABLT. Therefore, the voltage difference h1 between the first node SABLB and the second node SABLT may reduce the voltage difference h2 between the first node SABLB and the second node SABLT at the initial stage of the signal amplification stage t4, thereby causing the amplification speed of signals by the amplification circuit 1 to be reduced.

Figure 3:
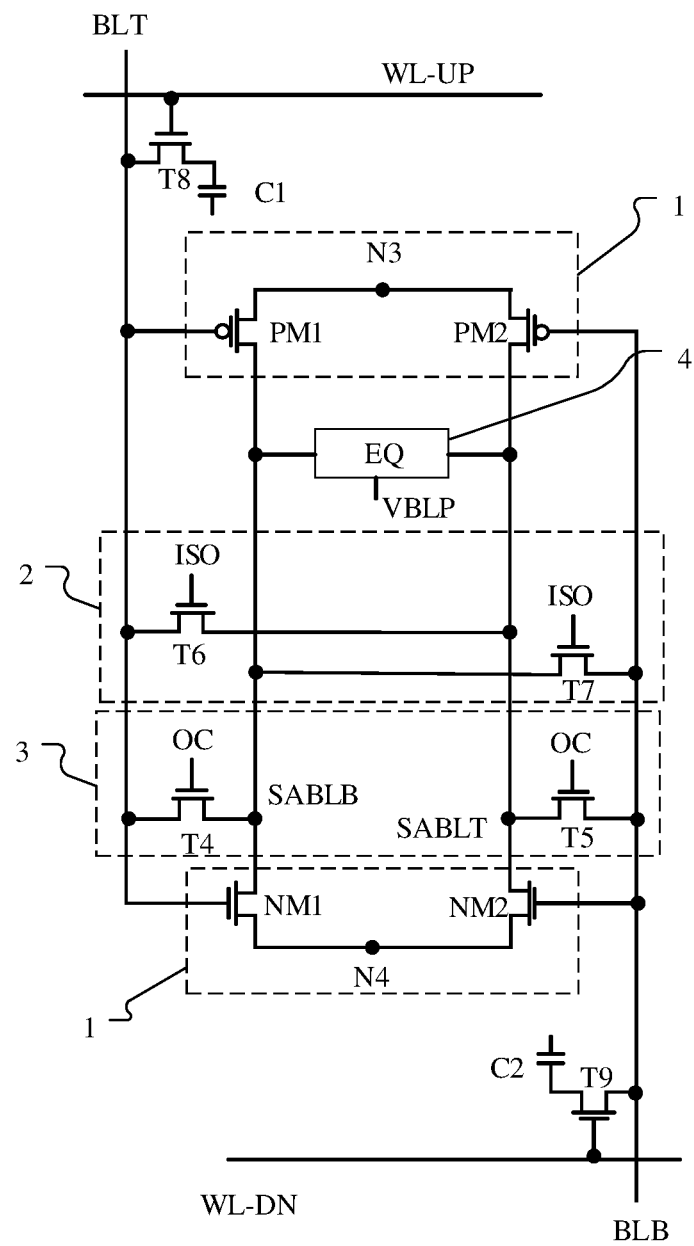
FIG. 3 is a schematic structural diagram of a sense amplifier according to another embodiment of the disclosure.

Based thereon, the embodiments further provide another sense amplifier, and FIG. 3 is a schematic structural diagram of a sense amplifier according to another embodiment of the disclosure. The sense amplifier may include an amplifying circuit 1 and a voltage equalizing circuit 4. The amplifying circuit 1 includes a first P-type transistor PM1, a second P-type transistor PM2, a first N-type transistor NM1 and a second N-type transistor NM2. The first P-type transistor PM1 has a first terminal connected to a third node N3, a second terminal connected to a first node SABLB, and a gate connected to a first bit line BLT. The second P-type transistor PM2 has a first terminal connected to the third node N3, a second terminal connected to a second node SABLT, and a gate connected to a second bit line BLB. The first N-type transistor NM1 has a first terminal connected to the first node SABLB, a second terminal connected to a fourth node N4, and a gate connected to the first bit line BLT. The second N-type transistor NM2 has a first terminal connected to the second node SABLT, a second terminal connected to the fourth node N4, and a gate connected to the second bit line BLB. The voltage equalizing circuit 4 is connected between the first node SABLB and the second node SABLT, and is configured to connect the first node SABLB and the second node SABLT in a charge sharing stage.

According to the sense amplifier provided by the embodiment of the disclosure, the voltage equalizing circuit 4 can be used to connect the first node SABLB and the second node SABLT in the charge sharing stage, to enable voltages of the first node SABLB and the second node SABLT to be equal, so that the pull-down action of the first node SABLB on the second bit line BLB in the initial stage of the signal amplification stage is reduced, the pull-up action of the second node SABLT on the first bit line BLT is also reduced. Therefore, the signal amplification speed of the amplifying circuit is improved.

In the embodiment of the disclosure, as shown in FIG. 3, the voltage equalizing circuit 4 is further connected to a pre-charging voltage end VBLP, and the voltage equalizing circuit 4 is further configured to transmit a pre-charging voltage at the pre-charging voltage end VBLP to the first node SABLB and the second node SABLT in a pre-charging stage, so that pre-charging of the first node SABLB and the second node SABLT is realized.

Figure 4:
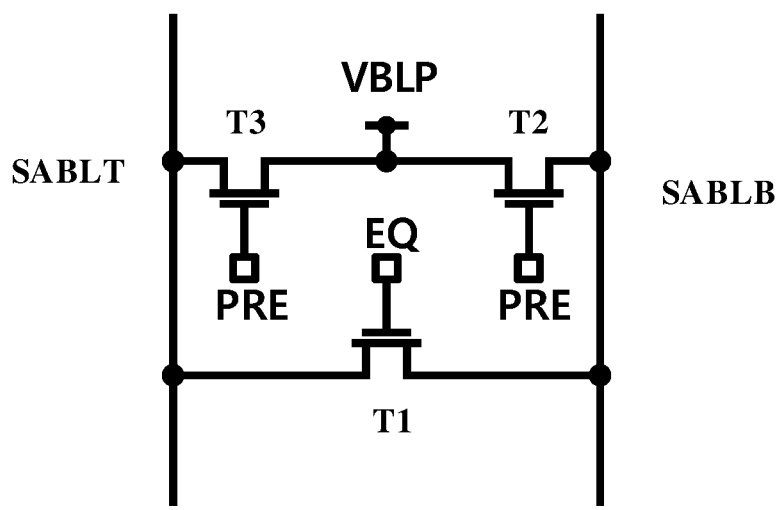
FIG. 4 is a schematic structural diagram of a voltage equalizing circuit in a sense amplifier according to an embodiment of the disclosure.

In the embodiment of the disclosure, FIG. 4 is a schematic structural diagram of a voltage equalizing circuit in a sense amplifier according to an embodiment of the disclosure. The voltage equalizing circuit 4 may include a first transistor T1, a second transistor T2 and a first transistor T3. The first transistor T1 has a first terminal connected to the first node SABLB, a second terminal connected to the second node SABLT, and a gate connected to a first control signal end EQ. The second transistor T2 has a first terminal connected to a pre-charging voltage end VBLP, a second terminal connected to the first node SABLB, and a gate connected to a pre-charging control end PRE. The third transistor T3 has a first terminal connected to the pre-charging voltage end VBLP, a second terminal connected to the second node SABLT, and a gate connected to the pre-charging control end PRE.

In the embodiment of the disclosure, as shown in FIG. 3, the sense amplifier may further include an offset cancelling circuit 3 and an isolation circuit 2. The offset cancelling circuit 3 is connected to the first bit line BLT, the second bit line BLB, the first node SABLB, the second node SABLT and the second control signal end OC, and is configured to respond to a signal of the second control signal end OC to connect the first bit line BLT and the first node SABLB, and respond to the signal of the second control signal end OC to connect the second bit line BLB and the second node SABLT. The isolation circuit 2 is connected to the first bit line BLT, the second bit line BLB, the first node SABLB, the second node SABLT and the third control signal end ISO, and is configured to respond to a signal of the third control signal end ISO to connect the first bit line BLT and the second node SABLT, and respond to the signal of the third control signal end ISO to connect the second bit line BLB and the first node SABLB.

In the embodiment of the disclosure, as shown in FIG. 3, the offset cancelling circuit 3 may include a fourth transistor T4 and a fifth transistor T5. The fourth transistor T4 has a first terminal connected to the first node SABLB, a second terminal connected to the first bit line BLT, and a gate connected to the second control signal end OC, and is configured to receive an offset cancelling signal. The fifth transistor T5 has a first terminal connected to the second node SABLT, a second terminal connected to the second bit line BLB, and a gate connected to the second control signal end OC, and is configured to receive an offset cancelling signal.

In the embodiment of the disclosure, as shown in FIG. 3, the isolation circuit 2 may include a sixth transistor T6 and a seventh transistor T7. The sixth transistor T6 has a first terminal connected to the first bit line BLT, a second terminal connected to the second node SABLT, and a gate connected to the third control signal end ISO, and is configured to receive an isolation signal. The seventh transistor T7 has a first terminal connected to the second bit line BLB, a second terminal connected to the first node SABLB, and a gate connected to the third control signal end ISO, and is configured to receive an isolation signal.

Figure 5:
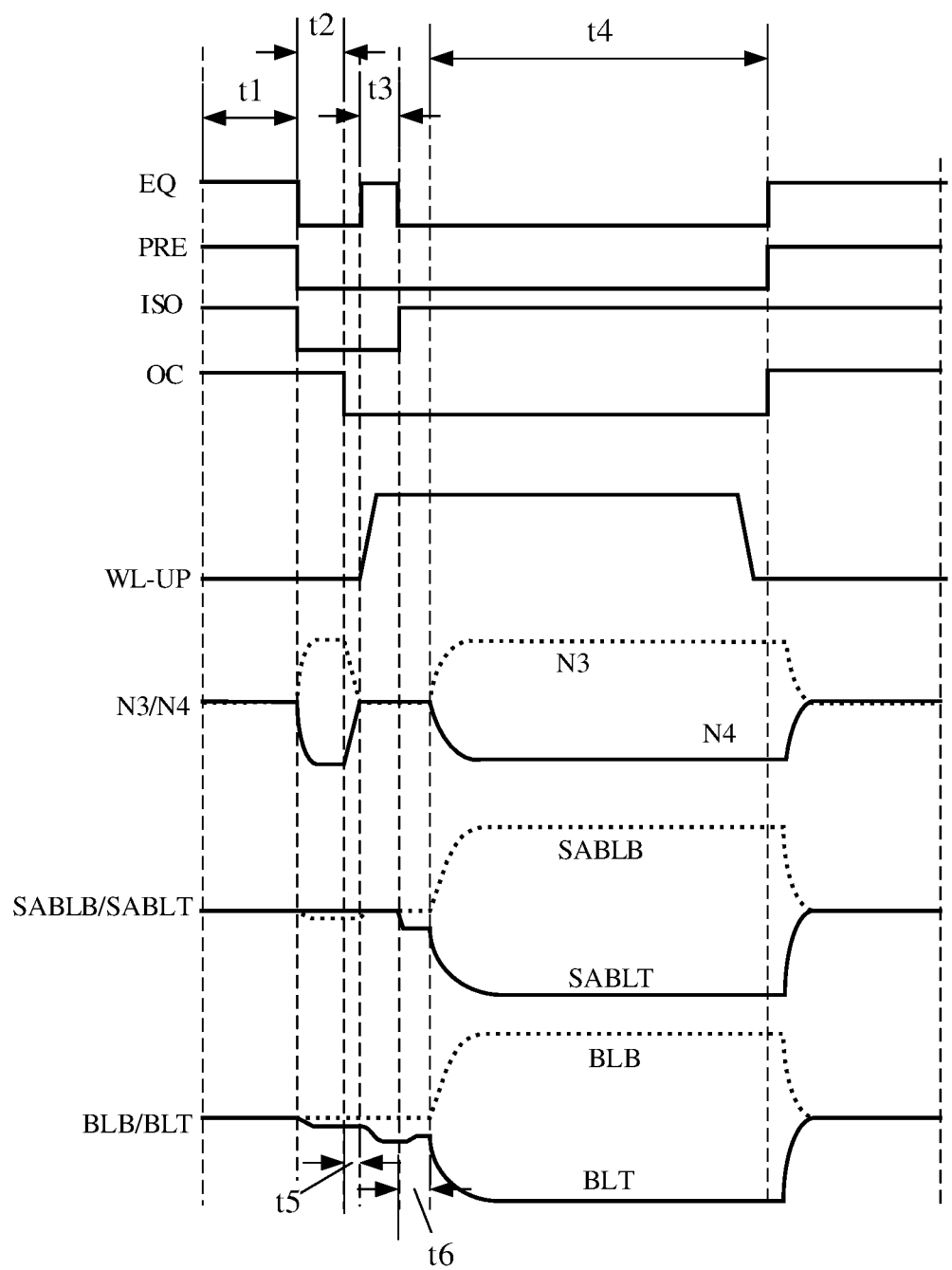
FIG. 5 is a timing diagram of each node in a method for driving a sense amplifier as shown in FIG. 3.

FIG. 5 illustrates a timing diagram of each node in a method for driving a sense amplifier as shown in FIG. 3. Herein, EQ is a timing diagram of the first control signal end, PRE is a timing diagram of the pre-charging control end, OC represents a timing diagram of the second control signal end, ISO represents a timing diagram of the third control signal end, WL-UP represents a timing diagram of the first word line, N3 (dotted line) represents a timing diagram of the third node, N4 (solid line) represents a timing diagram of the fourth node, SABLB (dotted line) represents a timing diagram of the first node, SABLT (solid line) represents a timing diagram of the second node, BLB (dotted line) represents a timing diagram of the second bit line, and BLT (solid line) represents a timing diagram of the first bit line. The method for driving a sense amplifier may include four stages: a pre-charging stage t1, an offset cancelling stage t2, a charge sharing stage t3 and a signal amplification stage t4.

Figure 6:
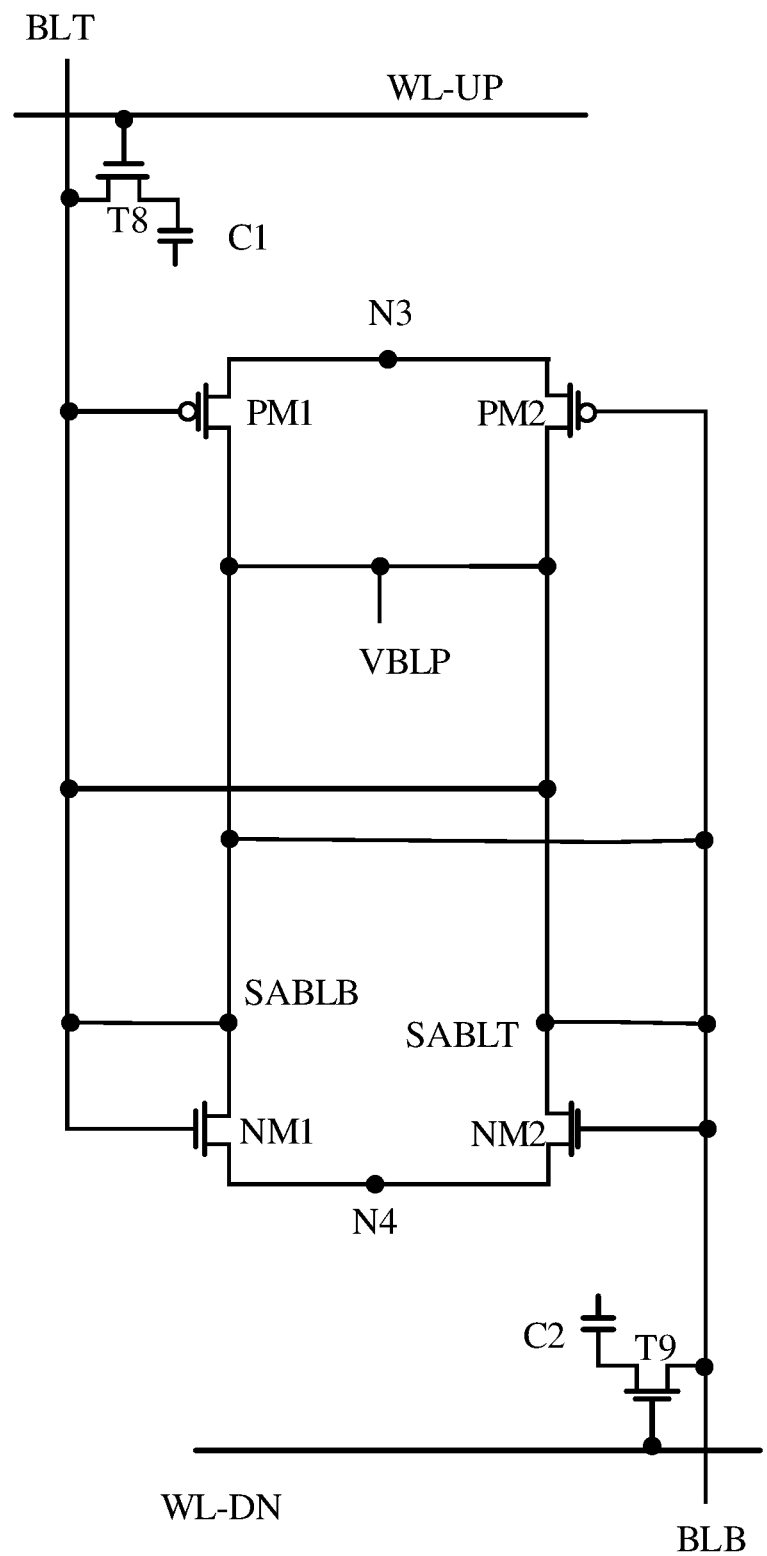
FIG. 6 is an equivalent state diagram of a sense amplifier in a pre-charging stage.

In the pre-charging stage t1, an equalization signal is provided to the first control signal end EQ to switch on the first transistor T1 and the second transistor T2. An offset cancelling signal is provided to the second control signal end OC to switch on the fourth transistor T4 and the fifth transistor T5. A high-level voltage is input to the third control signal end ISO to provide an isolation signal, to enable the sixth transistor T6 and the seventh transistor T7 to be switched on. FIG. 6 illustrates an equivalent state diagram of a sense amplifier in a pre-charging stage. The first transistor T1, the second transistor T2, the third transistor T3, the fourth transistor T4, the fifth transistor T5, the sixth transistor T6 and the seventh transistor T7 are all switched on. The pre-charging voltage end VBLP can provide a preset voltage to the first node SABLB and the second node SABLT, and provide the same preset voltage to the third node N3 and the fourth node N4, to enable the voltages of the first bit line BLT, the second bit line BLB, the first node SABLB, the second node SABLT, the third node N3 and the fourth node N4 to be all equal to the preset voltage.

Figure 7:
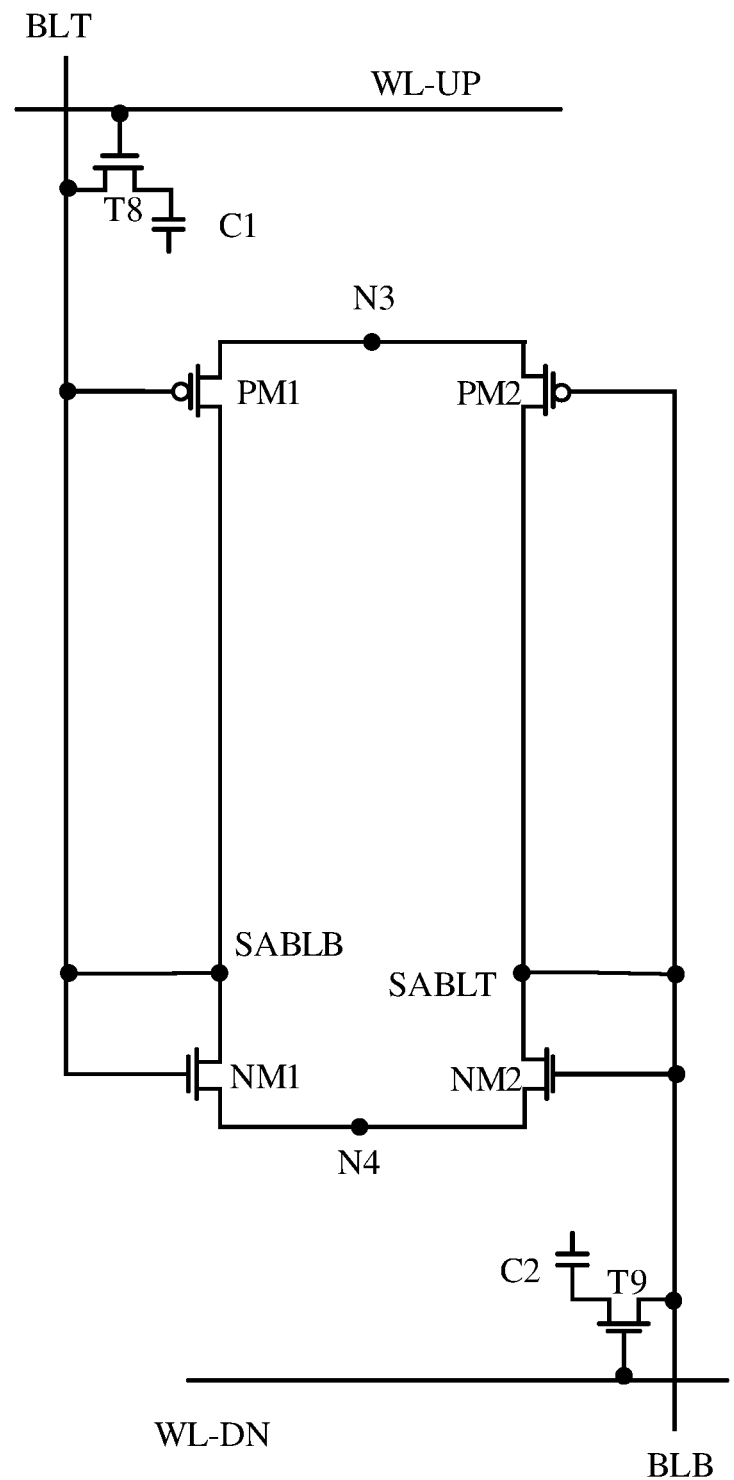
FIG. 7 is an equivalent state diagram of a sense amplifier in an offset cancelling stage.

In the offset cancelling stage t2, a first level is provided to the third node N3, a second level is provided to the fourth node N4, the first level may be a high level and second level may be a low level. An offset cancelling signal is provided to the second control signal end OC. In some embodiments, when the second control signal end OC is an N-type transistor, the offset cancelling signal provided to the second control signal end OC is a high-level voltage, in such a case, FIG. 7 illustrates an equivalent state diagram of a sense amplifier in an offset cancelling stage. The fourth transistor T4 and the fifth transistor T5 are switched on, and the first transistor T1, the second transistor T2, the third transistor T3, the sixth transistor T6 and the seventh transistor T7 are switched off. In some embodiments, when the first level provided to the third node N3 is a high level and the second level provided to the fourth node N4 is a low level, due to the amplification difference between the first P-type transistor PM1 and the second P-type transistor PM2, and the amplification difference between the first N-type transistor NM1 and the second N-type transistor NM2, the voltages at the first node SABLB and the second node SABLT may deviate from the pre-charging voltage V1. Furthermore, in some cases, the voltage of the first node SABLB is not equal to the voltage of the second node SABLT. For example, as shown in FIG. 7, the voltage of the first node SABLB is smaller than the voltage of the second node SABLT. Since the first node SABLB is connected to the first bit line BLT through the fourth transistor T4 and the second node SABLT is connected to the second bit line through the fifth transistor T5, in the t2 stage, the voltage of the first bit line BLT is also smaller than the voltage of the second bit line BLB, so that offset noise caused by amplification difference between the first P-type transistor PM1 and the second P-type transistor PM2 and amplification difference between the first N-type transistor NM1 and the second N-type transistor NM2 can be effectively cancelled.

Figure 8:
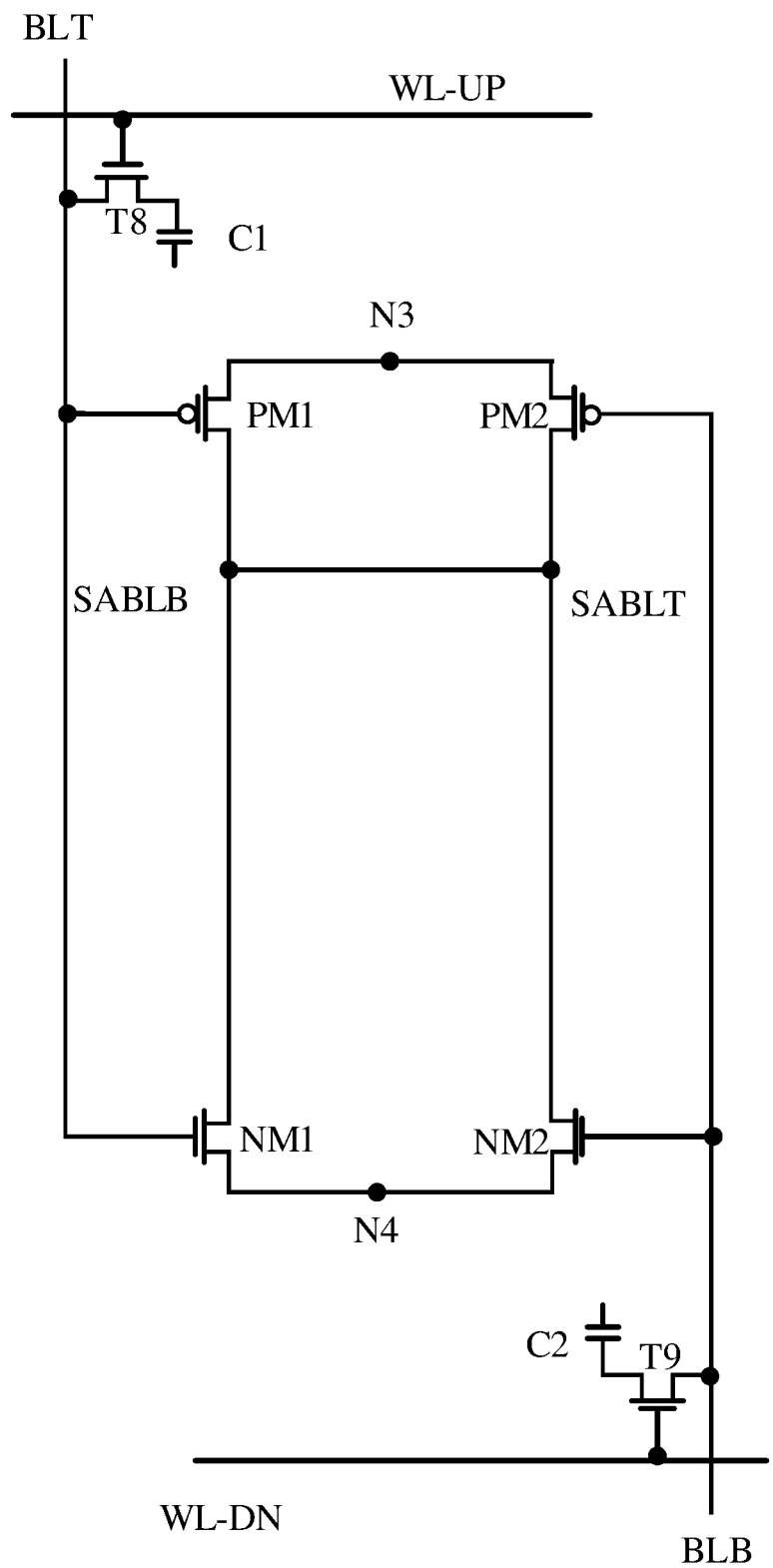
FIG. 8 is an equivalent state diagram of a sense amplifier in a charge sharing stage.

In the charge sharing stage t3, the third node N3 and the fourth node N4 are recovered to the preset voltage, an equalization signal is provided to the first control signal end EQ. FIG. 8 illustrates an equivalent state diagram of a sense amplifier in a charge sharing stage. The second transistor T2, the third transistor T3, the fourth transistor T4, the fifth transistor T5, the sixth transistor T6 and the seventh transistor T7 are all switched off. The first transistor T1 is switched on to connect the first node SABLB and the second node SABLT, to enable the voltages of the first node SABLB and the second node SABLT to be equal. Furthermore, the level signal of the first capacitor C1 may be a low level or a high level. In some embodiments, the voltage of the first bit line BLT is further pulled down when the level signal of the first capacitor C1 is a low level.

Figure 9:
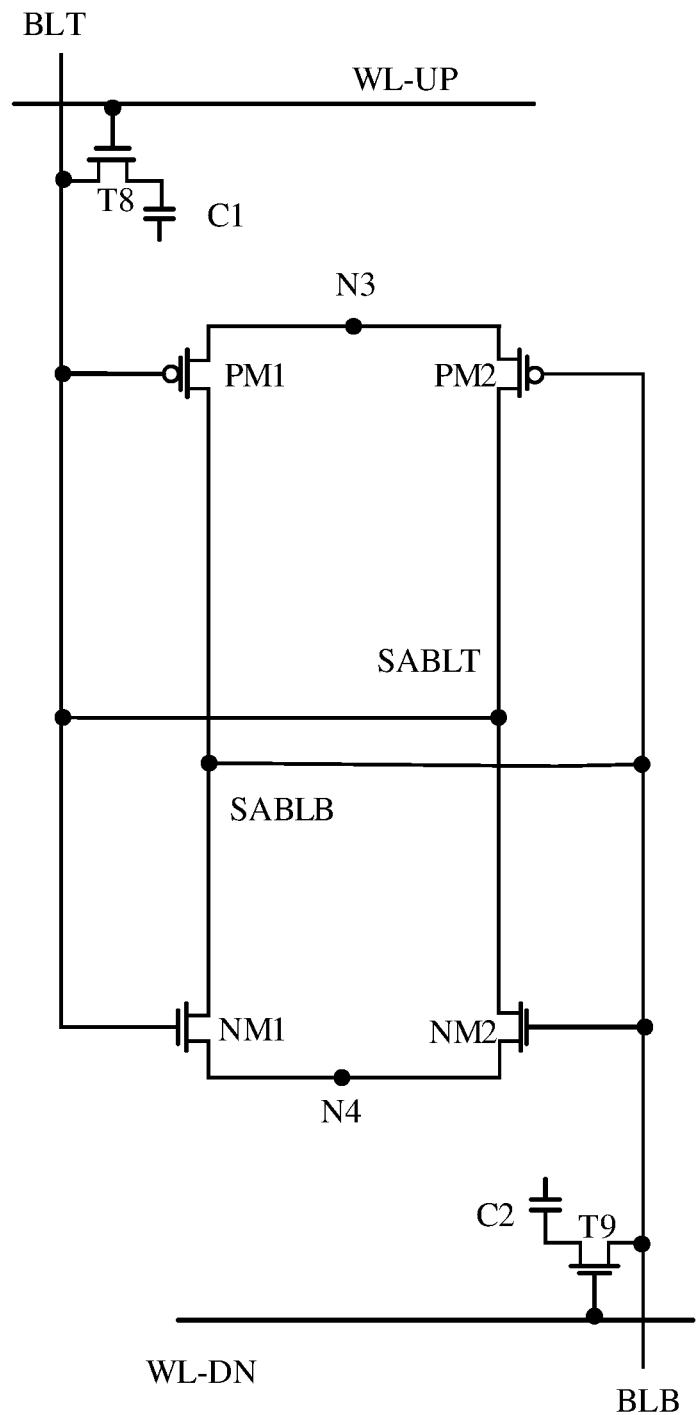
FIG. 9 is an equivalent state diagram of a sense amplifier in a signal amplification stage.

In the signal amplification stage t4, a first level is provided to the third node N3, and a second level is provided to the fourth node N4, and an isolation signal is provided to the third control signal end ISO. FIG. 9 illustrates an equivalent state diagram of a sense amplifier in a signal amplification stage. The fourth transistor T4 and the fifth transistor T5 are switched off, and the sixth transistor T6 and the seventh transistor are switched on. The first P-type transistor PM1 is switched on after receiving the voltage of the first bit line BLT, and the first node SABLB is pulled up to a high potential. The second N-type transistor NM2 is switched on after receiving the voltage of the second bit line BLB, and the second node SABLT is pulled down to a low potential. The amplifying circuit reads the stored data to the first bit line BLT and the second bit line BLB after sensing and amplifying the potentials of the first node SABLB and the second node SABLT, and recovers the data of a storage unit.

Figure 10:
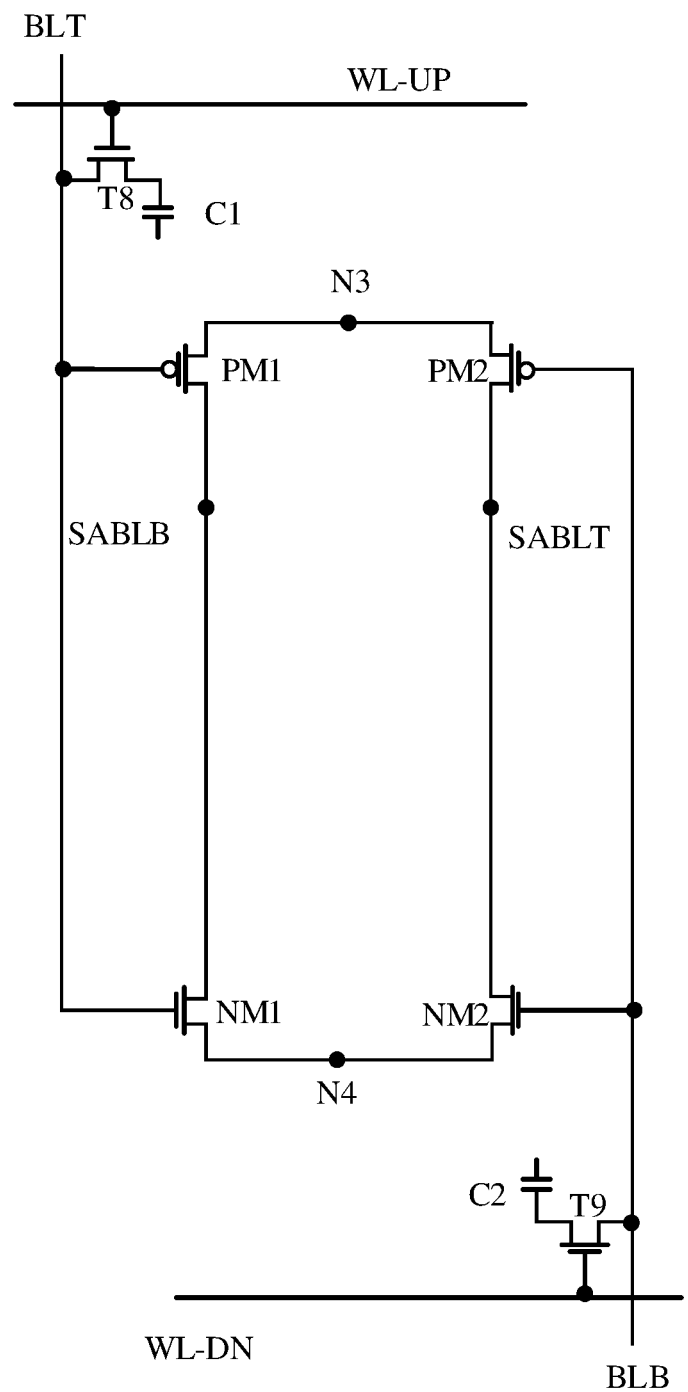
FIG. 10 is an equivalent state diagram of a sense amplifier in a charge cancelling stage.

As shown in FIG. 5, the method for driving a sense amplifier may further include a charge cancelling stage t5 between the offset cancelling stage t2 and the charge sharing stage t3. FIG. 10 illustrates an equivalent state diagram of a sense amplifier in a charge cancelling stage. In the charge cancelling stage t5, a preset voltage can be provided to the third node N3 and the fourth node N4, to enable the voltages of the third node N3 and the fourth node N4 to be pre-charged to the preset voltage before the charge sharing stage t3.

As shown in FIG. 5, the method for driving a sense amplifier may further include an amplification preparation stage t6 between the charge sharing stage t3 and the signal amplification stage t4, and an equivalent state diagram of a sense amplifier in the amplification preparation stage can be shown as FIG. 9.

Figure 11:
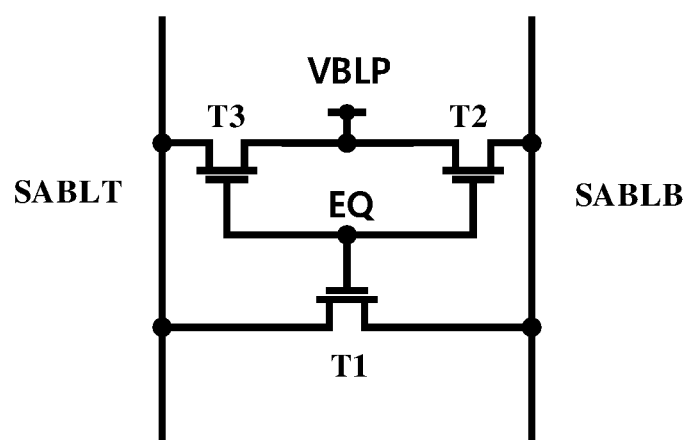
FIG. 11 is a schematic structural diagram of a voltage equalizing circuit in a sense amplifier according to another embodiment of the disclosure.

In other embodiments, the voltage equalizing circuit can also be of other structures. For example, FIG. 11 illustrates a schematic structural diagram of a voltage equalizing circuit in a sense amplifier according to another embodiment of the disclosure. The voltage equalizing circuit 4 may include a first transistor T1, a second transistor T2 and a third transistor T3. The first transistor T1 has a first terminal connected to the first node SABLB, a second terminal connected to the second node SABLT, and a gate connected to a first control signal end EQ. The second transistor T2 has a first terminal connected to a pre-charging voltage end VBLP, a second terminal connected to the first node SABLB, and a gate connected to the first control signal end EQ. The third transistor T3 has a first terminal connected to a pre-charging voltage end VBLP, a second terminal connected to the second node SABLT, a gate connected to the first control signal end EQ. The pre-charging voltage end VBLP in the voltage equalizing circuit does not provide pre-charging voltage in the charge sharing stage.

Figure 12:
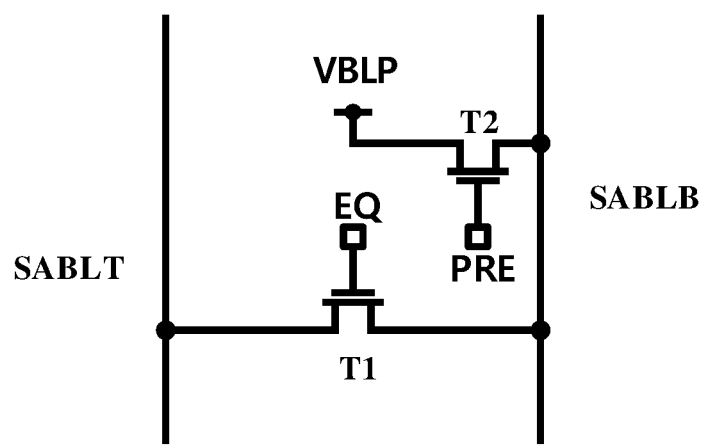
FIG. 12 is a schematic structural diagram of a voltage equalizing circuit in a sense amplifier according to another embodiment of the disclosure.

For another example, FIG. 12 illustrates a schematic structural diagram of a voltage equalizing circuit in a sense amplifier according to another embodiment of the disclosure. The voltage equalizing circuit 4 may include a first transistor T1 and a second transistor T2. The first transistor T1 has a first terminal connected to the first node SABLB, a second terminal connected to the second node SABLT, and a gate connected to a first control signal end EQ. The second transistor T2 has a first terminal connected to a pre-charging voltage end VBLP, a second terminal connected to the first node SABLB, and a gate connected to a pre-charging control end PRE. According to the circuit structure in the embodiment, the number of the transistors can be effectively reduced, and further, the area occupied by circuit elements in the corresponding layout design can be reduced.

Figure 13:
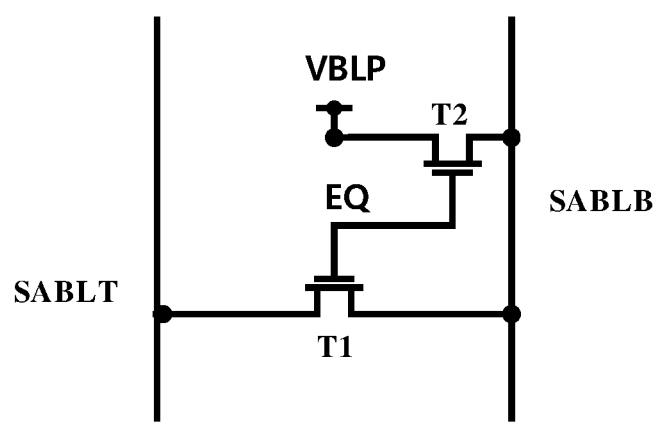
FIG. 13 is a schematic structural diagram of a voltage equalizing circuit in a sense amplifier according to another embodiment of the disclosure.

For another example, FIG. 13 illustrates a schematic structural diagram of a voltage equalizing circuit in a sense amplifier according to another embodiment of the disclosure. The voltage equalizing circuit 4 may include a first transistor T1 and a second transistor T2. The first transistor T1 has a first terminal connected to the first node SABLB, a second terminal connected to the second node SABLT, and a gate connected to a first control signal end EQ. The second transistor T2 has a first terminal connected to a pre-charging voltage end VBLP, a second terminal connected to the first node SABLB, and a gate connected to the first control signal end EQ. The pre-charging voltage end VBLP in the voltage equalizing circuit does not provide preset voltage in the charge sharing stage. According to the circuit structure in the embodiment, a pre-charging control end PRE does not need to be additionally arranged, pre-charging of the circuit can be achieved through the first control signal end EQ. Furthermore, the number of input ports is reduced, the number of the transistors is also reduced, and the area occupied by circuit elements in the corresponding layout design can be reduced.

The embodiments further provide a method for driving a sense amplifier which is described above, the method including: when the voltage equalizing circuit is connected to a pre-charging voltage end, in a pre-charging stage, the voltage equalizing circuit provides a preset voltage of the pre-charging voltage end to the first node and the second node; the offset cancelling circuit connects the first node and the first bit line, and connects the second node and the second bit line; and the isolation circuit connects the first node and the second bit line, connects the second node and the first bit line, and provides the preset voltage to the third node and the fourth node;

in an offset cancelling stage, the offset cancelling circuit connects the first node and the first bit line, connects the second node and the second bit line, provides a first level to the third node, and provides a second level to the fourth node;

in the charge sharing stage, the voltage equalizing circuit connects the first node and the second node, and provides the preset voltage to the third node and the fourth node; and in a signal amplification stage, the isolation circuit connects the first node and the second bit line, connects the second node and the first bit line, provides a first level to the third node, and provides a second level to the fourth node.

The method for driving a sense amplifier provided by the embodiment has been described in detail above and no elaboration will be made here.

The embodiment further provides a memory, which includes the sense amplifier described above.

Other embodiments of the disclosure will be apparent to the skilled in the art from consideration of the specification and practice of the disclosure disclosed here. This application is intended to cover any variations, uses, or adaptations of the disclosure following the general principles thereof and including common general knowledge or customary technical means in the technical field not disclosed by the present disclosure. The specification and embodiments are considered as exemplary only, with a true scope and spirit of the disclosure being indicated by the following claims.

It will be appreciated that the disclosure is not limited to the exact construction that has been described above and illustrated in the drawings, and that various modifications and changes may be made without departing from the scope thereof. The scope of the disclosure is only limited by the appended claims.

What is claimed is:

1. A sense amplifier, comprising:
an amplifying circuit, comprising:
a first P-type transistor, having a first terminal connected to a third node, a second terminal connected to a first node, and a gate connected to a first bit line;
a second P-type transistor, having a first terminal connected to the third node, a second terminal connected to a second node, and a gate connected to a second bit line;
a first N-type transistor, having a first terminal connected to the first node, a second terminal connected to a fourth node, and a gate connected to the first bit line; and
a second N-type transistor, having a first terminal connected to the second node, a second terminal connected to the fourth node, and a gate connected to the second bit line; and
a voltage equalizing circuit, connected between the first node and the second node, and configured to connect the first node and the second node in a charge sharing stage.

2. The sense amplifier of claim 1, wherein the voltage equalizing circuit is further connected to a pre-charging voltage end, and the voltage equalizing circuit is further configured to transmit a pre-charging voltage at the pre-charging voltage end to the first node and the second node in a pre-charging stage.

3. The sense amplifier of claim 2, wherein the voltage equalizing circuit comprises:
a first transistor, having a first terminal connected to the first node, a second terminal connected to the second node, and a gate connected to a first control signal end;
a second transistor, having a first terminal connected to the pre-charging voltage end, a second terminal connected to the first node, and a gate connected to a pre-charging control end; and a third transistor, having a first terminal connected to the pre-charging voltage end, a second terminal connected to the second node, and a gate connected to the pre-charging control end.

4. The sense amplifier of claim 2, wherein the voltage equalizing circuit comprises:
a first transistor, having a first terminal connected to the first node, a second terminal connected to the second node, and a gate connected to a first control signal end;
a second transistor, having a first terminal connected to the pre-charging voltage end, a second terminal connected to the first node, and a gate connected to the first control signal end; and
a third transistor, having a first terminal connected to the pre-charging voltage end, a second terminal connected to the second node, and a gate connected to the first control signal end.

5. The sense amplifier of claim 2, wherein the voltage equalizing circuit comprises:
a first transistor, having a first terminal connected to the first node, a second terminal connected to the second node, and a gate connected to a first control signal end; and
a second transistor, having a first terminal connected to the pre-charging voltage end, a second terminal connected to the first node, and a gate connected to a pre-charging control end.

6. The sense amplifier of claim 2, wherein the voltage equalizing circuit comprises:
a first transistor, having a first terminal connected to the first node, a second terminal connected to the second node, and a gate connected to a first control signal end; and
a second transistor, having a first terminal connected to the pre-charging voltage end, a second terminal connected to the first node, and a gate connected to the first control signal end.

7. The sense amplifier of claim 1, further comprising:
an offset cancelling circuit, connected to the first bit line, the second bit line, the first node, the second node and a second control signal end, and configured to respond to a signal of the second control signal end to connect the first bit line and the first node, and respond to the signal of the second control signal end to connect the second bit line and the second node; and
an isolation circuit, connected to the first bit line, the second bit line, the first node, the second node and a third control signal end, and configured to respond to a signal of the third control signal end to connect the first bit line and the second node, and respond to the signal of the third control signal end to connect the second bit line and the first node.

8. The sense amplifier of claim 7, wherein the offset cancelling circuit comprises:
a fourth transistor, having a first terminal connected to the first node, a second terminal connected to the first bit line, and a gate connected to the second control signal end; and
a fifth transistor, having a first terminal connected to the second node, a second terminal connected to the second bit line, and a gate connected to the second control signal end.

9. The sense amplifier of claim 7, wherein the isolation circuit comprises:

a sixth transistor, having a first terminal connected to the first bit line, a second terminal connected to the second node, and a gate connected to the third control signal end;
a seventh transistor, having a first terminal connected to the second bit line, a second terminal connected to the first node, and a gate connected to the third control signal end.

10. The sense amplifier of claim 8, wherein the fourth transistor and the fifth transistor are both N-type transistors, or the fourth transistor and the fifth transistor are both P-type transistors.

11. The sense amplifier of claim 9, wherein the sixth transistor and the seventh transistor are both N-type transistors, or the sixth transistor and the seventh transistor are both P-type transistors.

12. A method for driving a sense amplifier of claim 7, the method comprising: when the voltage equalizing circuit is connected to a pre-charging voltage end,
in a pre-charging stage, providing, by the voltage equalizing circuit, a preset voltage of the pre-charging voltage end to the first node and the second node; connecting, by the offset cancelling circuit, the first node and the first bit line, and connecting the second node and the second bit line; and connecting, by the isolation circuit, the first node and the second bit line, connecting the second node and the first bit line, and providing the preset voltage to the third node and the fourth node;
in an offset cancelling stage, connecting, by the offset cancelling circuit, the first node and the first bit line, connecting the second node and the second bit line, providing a first level to the third node, and providing a second level to the fourth node;
in the charge sharing stage, connecting, by the voltage equalizing circuit, the first node and the second node, and providing the preset voltage to the third node and the fourth node; and
in a signal amplification stage, connecting, by the isolation circuit, the first node and the second bit line, connecting the second node and the first bit line, providing a first level to the third node, and providing a second level to the fourth node.

13. The method for driving a sense amplifier of claim 12, further comprising:
in a charge cancelling stage, writing the preset voltage into the third node and the fourth node, the charge cancelling stage being between the offset cancelling stage and the charge sharing stage.

14. The method for driving a sense amplifier of claim 12, further comprising:
in an amplification preparation stage, connecting, by the isolation circuit, the first node and the second bit line, and connecting the second node and the first bit line, the amplification preparation stage being between the charge sharing stage and the signal amplification stage.

15. A memory, comprising a sense amplifier, wherein the sense amplifier comprises:
an amplifying circuit, comprising:
a first P-type transistor, having a first terminal connected to a third node, a second terminal connected to a first node, and a gate connected to a first bit line;
a second P-type transistor, having a first terminal connected to the third node, a second terminal connected to a second node, and a gate connected to a second bit line;

a first N-type transistor, having a first terminal connected to the first node, a second terminal connected to a fourth node, and a gate connected to the first bit line; and a second N-type transistor, having a first terminal connected to the second node, a second terminal connected to the fourth node, and a gate connected to the second bit line; and a voltage equalizing circuit, connected between the first node and the second node, and configured to connect the first node and the second node in a charge sharing stage.

16. The memory of claim 15, wherein the voltage equalizing circuit is further connected to a pre-charging voltage end, and the voltage equalizing circuit is further configured to transmit a pre-charging voltage at the pre-charging voltage end to the first node and the second node in a pre-charging stage.

17. The memory of claim 16, wherein the voltage equalizing circuit comprises:

a first transistor, having a first terminal connected to the first node, a second terminal connected to the second node, and a gate connected to a first control signal end;

a second transistor, having a first terminal connected to the pre-charging voltage end, a second terminal connected to the first node, and a gate connected to a pre-charging control end; and a third transistor, having a first terminal connected to the pre-charging voltage end, a second terminal connected to the second node, and a gate connected to the pre-charging control end.

18. The memory of claim 16, wherein the voltage equalizing circuit comprises:

a first transistor, having a first terminal connected to the first node, a second terminal connected to the second node, and a gate connected to a first control signal end;

a second transistor, having a first terminal connected to the pre-charging voltage end, a second terminal connected to the first node, and a gate connected to the first control signal end; and a third transistor, having a first terminal connected to the pre-charging voltage end, a second terminal connected to the second node, and a gate connected to the first control signal end.

19. The memory of claim 16, wherein the voltage equalizing circuit comprises:

a first transistor, having a first terminal connected to the first node, a second terminal connected to the second node, and a gate connected to a first control signal end; and a second transistor, having a first terminal connected to the pre-charging voltage end, a second terminal connected to the first node, and a gate connected to a pre-charging control end.

20. The memory of claim 16, wherein the voltage equalizing circuit comprises:

a first transistor, having a first terminal connected to the first node, a second terminal connected to the second node, and a gate connected to a first control signal end; and a second transistor, having a first terminal connected to the pre-charging voltage end, a second terminal connected to the first node, and a gate connected to the first control signal end.

* * * * *